US005328863A

United States Patent [19]

Cappelletti et al.

[11] Patent Number: 5,328,863
[45] Date of Patent: Jul. 12, 1994

[54] PROCESS FOR MANUFACTURING A ROM CELL WITH LOW DRAIN CAPACITANCE

[75] Inventors: Paolo Cappelletti, Seveso; Silvia Lucherini, Milan; Bruno Vajana, Bergamo, all of Italy

[73] Assignee: SGS-Thomson Microelectronics, S.r.l., Agrate Brianz, Italy

[21] Appl. No.: 668,873

[22] Filed: Mar. 13, 1991

[30] Foreign Application Priority Data

Mar. 15, 1990 [IT] Italy .................. 1969 A/90

[51] Int. Cl.⁵ .............. H01L 21/70; H01L 27/00
[52] U.S. Cl. ......................... 437/52; 437/48; 437/45
[58] Field of Search ............... 437/40, 41, 44, 45, 437/48, 52

[56] References Cited

U.S. PATENT DOCUMENTS

| | | | |
|---|---|---|---|
| 4,513,494 | 4/1985 | Batra | 437/48 |
| 4,514,897 | 5/1985 | Chiu et al. | 437/48 |
| 4,536,944 | 8/1985 | Bracco et al. | 437/44 |
| 4,649,629 | 3/1987 | Miller et al. | 437/48 |
| 4,649,638 | 3/1987 | Fang et al. | |
| 4,698,787 | 10/1987 | Mukherjee et al. | |
| 4,852,062 | 7/1989 | Baker et al. | |
| 4,868,619 | 9/1989 | Mukherjee et al. | |
| 4,874,713 | 10/1989 | Gioia | |
| 4,956,308 | 9/1990 | Griffin et al. | |
| 5,024,960 | 6/1991 | Haken | |
| 5,032,881 | 7/1991 | Sardo et al. | |
| 5,036,017 | 7/1991 | Noda | |
| 5,043,294 | 8/1991 | Willer et al. | |
| 5,141,890 | 8/1992 | Haken | |
| 5,155,056 | 10/1992 | Jeong-Gyoo | 437/52 |

FOREIGN PATENT DOCUMENTS

| | | | |
|---|---|---|---|
| 0227965 | 7/1987 | European Pat. Off. | |
| 0401113 | 12/1990 | European Pat. Off. | 437/48 |
| 0451883 | 10/1991 | European Pat. Off. | 437/48 |

OTHER PUBLICATIONS

Patent Abstracts of Japan, vol. 13, No. 304 (E-786) [3652], published Jul. 12, 1989, relating to Japanese Application JP-A-1 081 360, Hitachi Ltd., Mar. 27, 1989.

Patent Abstracts of Japan vol. 9, No. 85 (E-308) [1804], published Apr. 13, 1985, relating to Japanese Application JP-A-59 217 355, Hitachi Seisakusho K.K., Dec. 7, 1984.

Primary Examiner—Olik Chaudhuri
Assistant Examiner—H. Jey Tsai

[57] ABSTRACT

A process which provides for the creation of regions of source and drain having different doping, wherein the doping, and thus the capacitance, of the drain regions is lower than that of the source regions.

32 Claims, 1 Drawing Sheet

PROCESS FOR MANUFACTURING A ROM CELL WITH LOW DRAIN CAPACITANCE

FIELD OF THE INVENTION

The present invention relates to a process for the fabrication of an ROM memory cell having a low drain capacity.

BACKGROUND OF THE INVENTION

In the accomplishment of ROM memory cells organized according to NOR logic the starting point is typically a substrate of semiconductor material. A complex is formed, for example, by a layer of gate oxide-polysilicon-tungsten silicide. There follows an n-implantation, for example of phosphorus, suitable for creating the extension regions of source and drain, followed by a further n+ implantation, for example of arsenic, of part of the regions of source and drain.

After the execution of these operations it is possible to proceed to the programming of the memory cell, carried out by the patterned implantation of a dopant of type p, for example boron, which has the effect of raising the voltage threshold of each implanted cell, from a voltage Vt of less than 1 V for an unprogrammed cell to a voltage Vt=6 V for a programmed cell.

Due to the large thicknesses of the polysilicon (2000 Å) and of the tungsten silicide (2500 Å) such implantation of programming dopant requires a high energy, which causes the dopant itself to concentrate in the semiconductor substrate at the n+/substrate junctions of the regions of source and drain. In such a way, while the doping of the junction's n+ side is not altered, that of the substrate, already of the p type, rises considerably.

While the high doping of the substrate in the vicinity of the source junction does not create any problems (since the source lines are always grounded in the operation of the ROM), the doping of the substrate in the vicinity of the drain junction causes a drain capacitance of the programmed cell that is higher than that of the unprogrammed cell: the values measured in the two cases are 2.9 fF/bit (unprogrammed cell) and 6.4 fF/bit (programmed cell).

In particular, the drain capacitance of each cell affects the bit line capacitance of the memory which, together with the metallizing resistance, the polysilicon resistance and the word line capacitance, determines the total access time of the memory cell.

Such unbalance in the capacitance between a programmed cell and an unprogrammed cell is unacceptable because it cannot be corrected by means of a circuit: the number of programmed cells in an ROM can vary by as much as 100% (all cells are programmed/no cell is programmed) and this prevents an optimization of the circuit.

It is thus desirable to eliminate or, at least to substantially reduce, this large difference of capacity between a programmed cell and an unprogrammed cell.

The object of the present invention is to realize an ROM memory cell having a low drain capacity when the cell is programmed.

SUMMARY OF THE INVENTION

According to the invention such object is attained by means of a process for the fabrication of an ROM memory cell having a low drain capacity, comprising the formation of a gate complex on a part of a substrate of semiconductor material which shall form the cell's channel region and a subsequent step of n— implantation outside said channel region for the formation of regions of source and drain having n-doping, characterized in that it subsequently comprises the masking of the drain region and of an adjacent part of the gate complex and a subsequent step of n+ implantation for the creation of an area having n+ doping in said source region.

In this way, with respect to the known art, there is obtained a reduction of doping in the drain region which has the effect of widening the extension of the depletion region of the corresponding junction which, as is known, depends on the doping of the junction side having the lower doping.

The capacity of the drain region is thus reduced and with it the overall access time of the cell.

BRIEF DESCRIPTION OF THE DRAWINGS

The features of the present invention shall be made more evident by an embodiment illustrated as a non-limiting example in the accompanying drawings, wherein.

DESCRIPTION OF THE PREFERRED EMBODIMENT

Figure 1:
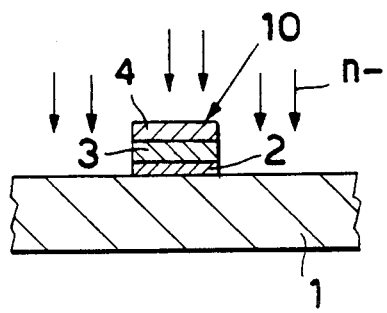
FIGS. 1 to 5 illustrate the different steps of the process according to the invention.

With reference to FIG. 1, on a semiconductor substrate 1 on which, over a part to form the cell's channel region there has been previously superimposed a gate complex 10 formed, in a way known in itself, by a triple layer of gate oxide-polysilicon-tungsten silicide 2, 3, 4, there is executed an n-implantation, in particular an implantation of phosphorus.

Figure 2:
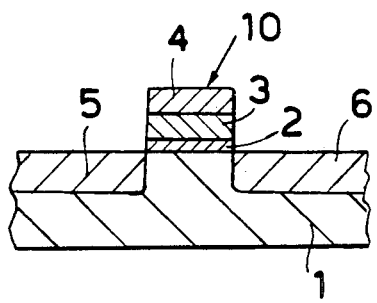

With reference to FIG. 2, such n— implantation has the object of creating two regions of source 5 and of drain 6, respectively.

Figure 3:
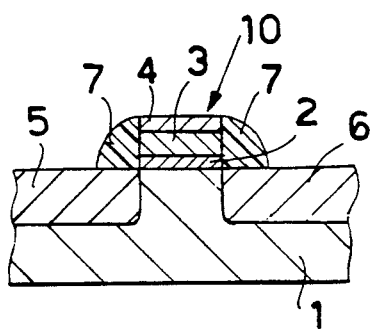

On substrate 1, on both sides of the gate complex 10, there are then deposited silicon dioxide spacers 7 (FIG. 3), which cover part of the regions of source and drain.

Figure 4:
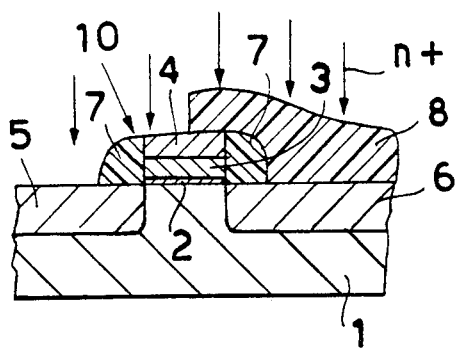

Over the drain region 6 there is subsequently superimposed a resist 8 which extends until it partially covers the gate complex 10 (FIG. 4).

Figure 5:
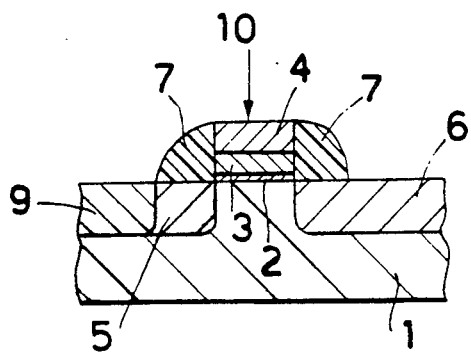

There is then executed an n+ implantation, for example of arsenic, which, as shown in FIG. 5, creates an n+ doping area 9 inside the source region 5.

The cell is now ready for programming, which may be executed conventionally with an implantation of p dopant, for example boron, which determines the rise in the cell's threshold voltage.

The presence of a low doping of the drain region 6 allows an appropriate limitation of the drain capacity of the programmed cell.

We claim:

1. A process for the fabrication of a ROM memory cell having a low drain capacitance, comprising the steps of:
   (a) forming a gate complex on each part of a p-type substrate of semiconductor material where a cell's channel region is to be located;
   (b) effecting n— implantation of said substrate in multiple regions which are adjacent to one of said channel regions and are not covered by any portion of said gate complex, to form n-type source and drain regions, said source and drain and channel regions of said cells defining a plurality of bitlines;

(c) after said step (b), masking said drain region and adjacent parts of said gate complex, and (d) after said step (c), effecting n+ implantation outside of the thus masked area for the creation of an area having n+ doping in a portion of said source region which is laterally separated from said channel region; and (e) implanting P-type dopants into said gate complex over selected ones of said channel regions, as defined by a masking layer, with an energy sufficiently to penetrate said gate complex thereover; whereby said selected ones of said channel regions have a resultingly elevated threshold voltage.

2. A process for the fabrication of a ROM memory cell having a low drain capacitance, comprising the steps of:

(a) forming a gate complex on each part of a p-type substrate of semiconductor material where a cell's channel region is to be located;

(b) effecting n− implantation of said substrate in multiple regions which are adjacent to one of said channel regions and are not covered by any portion of said gate complex, to form N-channel source and drain regions, said source and drain and channel regions of said cells defining a plurality of bitlines;

(c) masking said drain region and adjacent parts of said gate complex, and (d) effecting n+ implantation outside of the thus masked area for the creation of an area having n+ doping in said source region; and (e) implanting P-type dopants into said gate complex over selected ones of said channel regions with an energy sufficiently to penetrate said gate complex thereover; whereby said selected ones of said channel regions have a resultingly elevated threshold voltage; and further comprising the additional step of forming spacers to the sides of said gate complex after said step of n− implantation and before said step of masking.

3. The method of claim 1, wherein said step (a) forms said gate complex to include both polysilicon and silicide.

4. The method of claim 1, wherein said step (b) implants phosphorus.

5. The method of claim 1, wherein said step (d) implants arsenic.

6. The method of claim 1, wherein said step (e) implants boron.

7. A method of fabricating an array of NOR-type ROM cells, comprising the steps of:

(a) providing a substrate including exposed p-type regions of monolithic semiconductor material at a first surface thereof;

(b) forming a thin gate dielectric layer thereon;

(c) forming a patterned conductive gate layer on said gate dielectric, said gate layer crossing said exposed p-type regions at channel locations therein, multiple ones of said channel locations being spaced to define an array of NOR-type ROM cells;

(d) implanting a first n-type dopant, into said exposed p-type regions where not covered by said gate layer, to form source and drain regions of the array of NOR-type ROM cells;

(e) after said step (d), forming a sidewall spacer on said gate layer;

(f) after said step (e), implanting a second n-type dopant, for ones of said channel regions, into a respective source region adjacent thereto but NOT into a respective drain region adjacent thereto;

(g) implanting a p-type dopant, through said gate layer into selected ones of said channel regions as defined by a masking layer, to store data.

8. The method of claim 7, wherein said gate dielectric comprises silicon dioxide.

9. The method of claim 7, wherein said gate layer comprises a polysilicon/silicide stack.

10. The method of claim 7, wherein said first and second n-type dopants are different.

11. The method of claim 7, wherein said step (d) implants phosphorus.

12. The method of claim 7, wherein said step (e) comprises deposition of silicon dioxide.

13. The method of claim 7, wherein said step (f) implants arsenic.

14. The method of claim 7, wherein said step (g) implants boron.

15. A method of fabricating an array of NOR-type ROM cells, comprising the steps of:

(a) providing a substrate including exposed p-type regions of monolithic semiconductor material at a first surface thereof;

(b) forming a gate oxide layer thereon;

(c) forming a patterned thin film polysilicon/silicide layer on said gate oxide, said polysilicon/silicide layer crossing said exposed p-type regions at channel locations therein, multiple ones of said channel locations being spaced to define an array of NOR-type ROM cells;

(d) implanting a first n-type dopant, into said exposed p-type regions where not covered by said polysilicon/silicide layer, to form source and drain regions of the array of NOR-type ROM cells;

(e) after said step (d), forming a sidewall spacer on said polysilicon/silicide layer;

(f) after said step (e), implanting a second n-type dopant, for ones of said channel regions, into a respective source region adjacent thereto but NOT into a respective drain region adjacent thereto; and (g) implanting a p-type dopant, through said polysilicon/silicide layer into selected ones of said channel regions as defined by a masking layer, to store data.

16. The method of claim 15, wherein said first and second n-type dopants are different.

17. The method of claim 15, wherein said step (d) implants phosphorus.

18. The method of claim 15, wherein said step (e) comprises deposition of silicon dioxide.

19. The method of claim 15, wherein said step (f) implants arsenic.

20. The method of claim 15, wherein said step (g) implants boron.

21. The method of claim 2, wherein said step (a) forms said gate complex to include both polysilicon and silicide.

22. The method of claim 2, wherein said step (b) implants phosphorus.

23. The method of claim 2, wherein said step (d) implants arsenic.

24. The method of claim 2, wherein said step (e) implants boron.

25. The method of claim 2, wherein said step of forming spacers forms said spacers of silicon dioxide.

26. The method of claim 7, wherein said step (g) is performed after said step (f).

27. The method of claim 15, wherein said step (g) is performed after said step (f).

28. A method of fabricating an array of NOR-type ROM cells, comprising the steps of:
(a) providing a substrate including monolithic semiconductor material of a first conductivity type at a first surface thereof;
(b) forming a gate oxide layer thereon;
(c) forming a patterned thin film polycrystalline conductive layer comprising silicon on said gate oxide, said conductive layer crossing said exposed first-conductivity-type regions at channel locations therein, multiple ones of said channel locations being spaced to define an array of NOR-type ROM cells;
(d) implanting a second-conductivity-type dopant, into said exposed p-type regions where not covered by said polysilicon/silicide layer, to form source and drain regions of the array of NOR-type ROM cells;
(e) after said step (d), forming a sidewall spacer on said conductive layer;
(f) after said step (e), implanting a second-conductivity-type dopant, for ones of said channel regions, into a respective source region adjacent thereto but NOT into a respective drain region adjacent thereto; and
(g) implanting a first-conductivity-type dopant into selected ones of said ROM cells, as defined by a masking layer, to store data.

29. The method of claim 28, wherein said conductive layer is a polysilicon/silicide stacked layer.

30. The method of claim 28, wherein said first conductivity type is p-type, and said second conductivity type is n-type.

31. The method of claim 28, wherein said first conductivity type is p-type, and said second conductivity type is n-type, and said step (b) implants phosphorus, and said step (d) implants arsenic, and said step (e) implants boron.

32. The method of claim 28, wherein said step of forming spacers forms said spacers of silicon dioxide.

* * * * *

UNITED STATES PATENT AND TRADEMARK OFFICE
CERTIFICATE OF CORRECTION

PATENT NO. : 5,328,863
DATED : July 12, 1994
INVENTOR(S) : Cappelletti et al.

It is certified that error appears in the above-indentified patent and that said Letters Patent is hereby corrected as shown below:

On the title page, item [73] should read as follows:

Assignee: SGS-Thomson Microelectronics S.r.l.
Agrate Brianza (Milano), Italy;

and item [30] should read as follows

Foreign Application Priority Data

Mar. 15, 1990 [IT] Italy 19694 A/90

Signed and Sealed this

Second Day of July, 1996

Attest:

BRUCE LEHMAN

Attesting Officer

Commissioner of Patents and Trademarks